United States Patent
Otsuka et al.

[11] Patent Number: 6,040,094
[45] Date of Patent: Mar. 21, 2000

[54] MASK FOR PILING PROCESS, MASK-PRODUCING METHOD, AND MASK-EMPLOYING METHOD

[75] Inventors: Yukio Otsuka, Aichi-ken; Motoaki Ozaki, Okazaki, both of Japan

[73] Assignee: Toyota Jidosha Kabushiki Kaisha, Japan

[21] Appl. No.: 09/065,615

[22] Filed: Apr. 24, 1998

[30] Foreign Application Priority Data

Apr. 25, 1997 [JP] Japan ..................... 9-109115
Feb. 27, 1998 [JP] Japan ..................... 10-047649

[51] Int. Cl.⁷ ..................................... G03F 9/00
[52] U.S. Cl. ............... 430/5; 430/4; 430/6; 428/195; 428/332
[58] Field of Search ................... 428/195, 332; 164/456, 15, 21; 264/219, 401, 308, 331.19, 331.21; 430/5, 4, 6

[56] References Cited

U.S. PATENT DOCUMENTS

| 4,247,508 | 1/1981 | Housholder . |
| 4,293,624 | 10/1981 | Buckley ........................... 430/5 |
| 5,204,055 | 4/1993 | Sachs et al. . |
| 5,354,414 | 10/1994 | Feygin . |
| 5,718,279 | 2/1998 | Satoh et al. . |

FOREIGN PATENT DOCUMENTS

| 0470705A2 | 2/1992 | European Pat. Off. . |
| 0588580A2 | 3/1994 | European Pat. Off. . |
| 0776713A2 | 6/1997 | European Pat. Off. . |
| 3-183530 | 8/1991 | Japan . |

OTHER PUBLICATIONS

English Abstract of Japanese Application 62245785 dated Oct. 1, 1987, *Patent Abstracts of Japan.*
European Search Report dated May 20, 1999 by Examiner U. Haenisch at The Hague.

*Primary Examiner*—William Krynski
*Assistant Examiner*—Hong J. Xu
*Attorney, Agent, or Firm*—Finnegan, Henderson, Farabow, Garrett & Dunner, L.L.P.

[57] ABSTRACT

The present invention mask 1 has a mask-portion 12. The mask-portion 12 comprises: a bed sheet layer 12c made of paper or resin; and an irradiation-resistant layer 12e made of metal and coated on the irradiation side of the bed sheet layer 12c. The irradiation-resistant layer 12e has durability with respect to the emitted energy such as laser beam than the bed sheet layer 12c.

26 Claims, 9 Drawing Sheets

MASK FOR PILING PROCESS, MASK-PRODUCING METHOD, AND MASK-EMPLOYING METHOD

BACKGROUND OF THE INVENTION

1. Field of the Invention

This invention relates to a mask, a mask-producing method, and a mask-employing method in a piling process for producing a three-dimensional laminated object.

2. Description of the Related Art

There has recently been developed a technique, a piling process, for producing a three-dimensional laminated object. It is disclosed in Japanese Unexamined Patent Publication (KOKAI) No. 3-183,530 and U.S. Pat. No. 4,247,508. This technique emits energy, such as a laser beam, an ultraviolet ray, to material such as resin-coated sand, liquid resin so as to form a solid layer, thereby piling the plural solid layers in a thickness direction to produce the three-dimensional object.

The present applicant has developed a technique in which a mask covers the resin-coated sand, and in which energy such as a laser beam and an infrared ray is emitted to the resin-coated sand covered with the mask. This technique is advantageous in improving productivity since the laminated product is easily produced corresponding to a designated pattern of the mask. The conventionally developed mask 100, shown in FIG. 17, includes an insular shaped mask-portion 101 having a designated pattern for interrupting energy such as a laser beam, an infrared ray, or an ultraviolet ray, a frame portion 102, and a plurality of supporting arms 103 for holding the mask-portion 101 onto the frame portion 102. The mask 100 is formed by cutting a thin metal plate such as a steel plate, a stainless steel plate, an aluminum plate, by use of a laser beam, thereby having a designated pattern.

For piling the plural solid layers, the aforementioned technique for producing the three-dimensional object requires a plurality of masks. So, this technique requires producing a plurality of masks rapidly and at a low cost.

The conventionally developed mask requires a large output power and a long cutting time, since it is formed by cutting the thickened metal plate such as the steel plate, the stainless steel plate, the aluminum plate, by use of a laser beam. Thus, the conventionally developed mask has a limit in shortening time for producing a mask, and a limit in reducing a mask cost.

Since the conventionally developed mask has a feature that the insular mask-portions 101 is held by the plural supporting arms 103 comprising complicated shapes, it causes an increase of irradiation time and a complicated computer program, thereby inducing disadvantages in shortening time for producing a mask and in reducing a mask cost.

SUMMARY OF THE INVENTION

The present invention has been developed in view of the aforementioned circumstance. It is therefore a first aim of the present invention to provide a mask, a mask-producing method which are advantageous in shortening time for producing a mask and in reducing a mask cost.

It is therefore a second aim of the present invention to provide a mask-employing method which is advantageous in ensuring strength of a laminated object.

The present inventors have developed a mask to be used in a piling process for producing a three-dimensional laminated object. Accordingly, they have known that mask-producing time and mask costs are decreased provided that an irradiation-resistant layer is coated on a bed sheet layer for having durability with respect to emitted energy than the bed sheet layer. On the basis of such knowledge, they have completed the present invention.

According to a first aspect of the present invention, a mask is to be used in a piling process for producing a three-dimensional laminated object by piling a plurality of solid layers formed by receiving energy emitted from an emitting source.

The mask according to the first aspect comprises:
a bed sheet layer having a designated pattern and having an irradiation side; and
an irradiation-resistant layer coated on the irradiation side of the bed sheet layer and having durability with respect to the emitted energy than the bed sheet layer.

The first aspect of the present invention provides a new-type mask, as compared with the conventionally developed mask formed by cutting the thickened metal plate by use of the laser beam. The first aspect of the present invention is advantageous in shortening time for producing a mask and in reducing a mask cost, as compared with the conventionally developed mask formed by cutting the thickened metal plate by use of the laser beam.

According to a second aspect of the present invention, a basic ingredient of the bed sheet layer is organic material. So, the second aspect of the present invention is further advantageous in shortening time for producing a mask and in reducing a mask cost, as compared with the conventionally developed mask formed by cutting the thickened metal plate by use of the laser beam. Also, the second aspect of the present invention has an advantage in that the irradiation-resistant layer may reinforce the bed sheet layer made of the organic material.

According to a third aspect of the present invention, the bed sheet layer is held a mesh member. So, it has an advantage in that the mask-portion is securely held. Also, it has an advantage in that the mesh member reinforces the mask-portion even when the mask-portion is thin. Reinforcing the mask-portion induces an advantage in ensuring strength of the mask-portion, even when the bed sheet layer is formed of paper or resin, or even when the bed sheet layer is thin.

According to a fourth aspect of the present invention, the irradiation-resistant layer is formed from a deposited coat, such as an aluminum deposited layer. Metal such as aluminum greatly has a laser-reflecting ability for reflecting a laser beam; nevertheless, a deposited coat constituted by metal is easy in laser-cut. The reason may be that deposited metal particles constituting the deposited coat allow the laser beam to penetrate therein. So, in case where the irradiation-resistant layer is a deposited coat, it may be cut easily by use of a laser beam.

According to a fifth aspect of the present invention, the bed sheet layer has a rolled-shape in which a plurality of patterns are arranged side by side in a rolling direction. So, the fifth aspect of the present invention is advantageous in setting mask-size small and in decreasing mask-exchanging time, even when a mask has a plurality of patterns.

According to a sixth aspect of the present invention, a mask-producing method, the mask is to be used in a piling process for producing a three-dimensional laminated object by piling a plurality of solid layers formed by receiving energy emitted from an emitting source.

The mask-producing method according to the sixth aspect comprises the steps of:

using a mesh member having a mesh and a sheet material held on the mesh;

removing an unnecessary portion in the sheet material of the mesh member, thereby making a bed sheet layer having a designated pattern; and coating an irradiation-resistant layer on the bed sheet layer, thereby producing a mask-portion. The irradiation-resistant layer has durability with respect to the emitted energy than the bed sheet layer.

So, the sixth aspect of the present invention is advantageous in shortening time for producing a mask and in reducing a mask cost, as compared with the conventional mask formed by cutting the thickened metal plate by use of the laser beam. Also, the sixth aspect of the present invention is advantageous in reinforcing the mask-portion, provided that the irradiation-resistant is thick. Also, the mesh member advantageously reinforces the mask-portion. Thus, the sixth aspect is advantageous in abolishing and simplifying supporting arms for supporting a mask-portion, as compared with the aforementioned conventional technique.

According to a seventh aspect of the present invention, a mask-producing method, the mask is to be used in a piling process for producing a three-dimensional laminated object by piling a plurality of solid layers formed by receiving energy emitted from an emitting source.

The mask-producing method according to the seventh aspect comprises the steps of:

using a sheet material coating an irradiation-resistant layer having durability with respect to the emitted energy than the sheet material;

cutting the sheet material in such a manner that an unnecessary portion is removed in the sheet material, thereby making a mask-portion having a designated pattern; and setting the mask-portion onto a mesh member to produce the mask.

So, the seventh aspect of the present invention is advantageous in shortening time for producing a mask and in reducing a mask cost, as compared with the conventional mask formed by cutting the thickened metal plate by use of the laser beam.

According to a eighth aspect of the present invention, a mask-employing method is for employing a mask in a piling process for producing a three-dimensional laminated object by piling a plurality of solid layers formed by receiving energy emitted from an emitting source.

The mask-employing method according to the eighth aspect comprises the steps of:

using a plurality of masks to be the former mask and the latter mask respectively, and having a mesh member constituted with a plurality of wires;

shifting a wire-position between the former mask and the latter mask in a direction exhibiting a mask-surface in emitting energy in such a manner that overlap is suppressed between the wires of the latter mask and the wires of the former mask.

So, even when the solid layer has insufficiently-hardened portions at locations facing to the back side of the wires constituting the mesh member, the insufficiently-hardened portions are shifted in the direction exhibiting the mask-surface. Thus, the eighth aspect of the present invention prevents the insufficiently-hardened portions from being continuously overlapped as much as possible, and thereby it advantageously prevents the three-dimensional laminated object from peeling.

SUITABLE MODE

In the present invention, a mask covers a material capable of becoming a solid layer, such as resin-coated sand, and liquid resin. Thereafter, energy, including a visible ray or an invisible ray, such as a laser beam, an ultraviolet ray, and an infrared ray, is emitted to the material covered with the mask, thereby hardening the material irradiated with energy.

On the other hand, since the mask interrupts laser-irradiation, a portion covered by the mask isn't hardened or it is insufficiently hardened. So, the present invention allows a solid layer to have a shape corresponding to a pattern of the mask, and it allows a plurality of solid layers to be piled so as to a three-dimensional laminated object.

A bed sheet layer may preferably be made of organic material such as paper and resin, in consideration of a cutting property that a designated pattern is cut by a cutting means such as a laser beam cutter and a mechanical cutter. The organic material induces an easy operation in cutting it by use of the cutting means such as the laser beam cutter and the mechanical cutter. Paper may be machine-made paper, Japanese paper, or synthesized paper. The resin may be polyethylene terephthalate (PET), polyimide (PI), polyethylene (PE), polypropylene (PP), polystyrene (PS), polyvinyl chloride (PVC), polymethyl methacrylate (PMMA), or the like.

A thickness of the bed sheet layer may be, for example, approximately 0.05–5 mm, 0.1–0.4 mm, depending on the kinds of materials constituting the bed sheet layer and the kinds of the mask. This thickness isn't restricted within these range in the present invention.

In the present invention, an irradiation-resistant layer, having durability with respect to the emitted energy, is coated on the bed sheet layer. The irradiation-resistant layer may be made of metal such as aluminum family, stainless steel family, and copper family. Also, the irradiation-resistant layer may be constituted in a mode that a liquid material dispersing powder such as metal-powder is coated and dried on the bed sheet layer. The irradiation-resistant layer may be constituted in another mode that a thin film such as a metal-film and a metal-foil adheres onto the bed sheet layer.

The irradiation-resistant layer is preferably made from a deposited coat. The deposited coat may be a deposited metal coat. A representative substance constituting the deposited coat may be aluminum, zinc, tin, molybdenum, nickel-chromium, or the like. The deposited coat may be a coat formed by use of physically vapor-depositing methods—a vacuum depositing, a sputtering, and an ion plating.

A thickness of the deposited coat may be selected depending on the kinds of the mask and the kinds of the deposited substance. Excessive thickness of the deposited coat causes a difficulty in cutting it. Also, the excessive thinness of the deposited coat deteriorates wear-resistant thereof. So, the thickness of the deposited coat is preferably decided in view of these factors.

As for the deposited coat, for instance, an upper limit may be 500 Å, 800 Å, 1000 Å, 1 $\mu$m, or 2 $\mu$m; and a lower limit may be 50 Å, 200 Å, or 500 Å. Therefore, an average thickness of the deposited coat may be set in the range 500–800 Å. It isn't restricted within these range in the present invention.

It is preferable that a protecting coat covers the deposited coat for improving wear-resistant thereof. Thickening the deposited coat may sometimes omit the protecting coat.

According to a preferable mode of the present invention, the bed sheet layer is held on a mesh member. The mesh member may be a mesh on the market, knitted out of wires, or a mesh made of powder-particles bonded by scanning a laser beam onto powder-layer.

BRIEF DESCRIPTION OF THE DRAWINGS

FIG. 6(A) is a plane view showing a mesh member;

FIG. 6(B) is a plane view showing a situation in which a bed sheet layer adheres on the mesh member;

FIG. 6(C) is a plane view showing a situation in which a bed sheet layer is cut by use of a laser beam;

FIG. 6(D) is a plane view showing a situation in which unnecessary portions are removed from the bed sheet layer;

FIG. 7(A) is a plane view showing a sheet material;

FIG. 7(B) is a plane view showing a situation in which the sheet material is cut by use of a laser beam;

FIG. 7(C) is a plane view showing a mesh member;

FIG. 7(D) is a plane view showing a situation in which mask-portions adheres onto the mesh member;

DESCRIPTION OF THE PREFERRED EMBODIMENT

The preferred embodiments will hereinafter be described with reference to the accompanied drawings.

EXAMPLE 1

Embodiment Constitution

Figure 1:
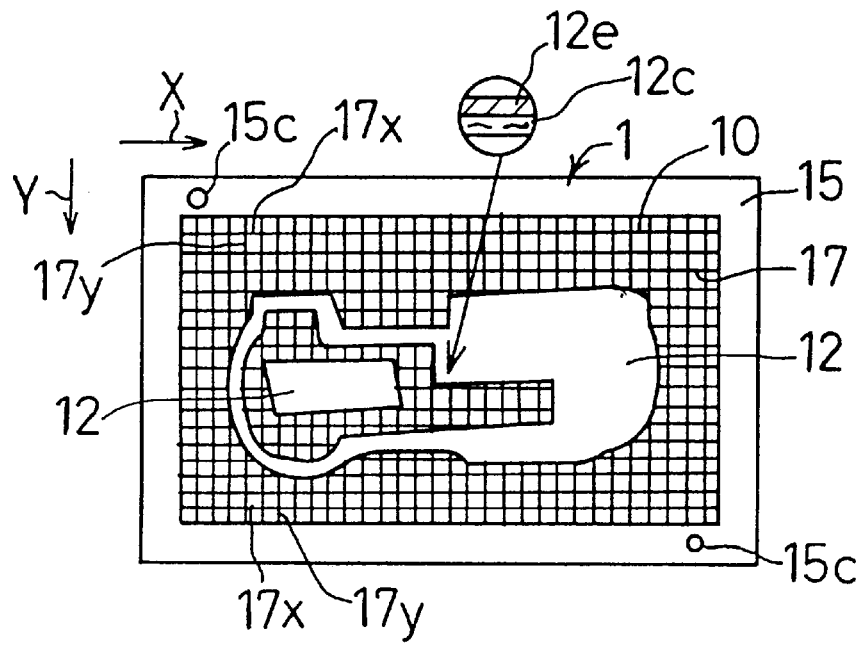
FIG. 1 is a plane view concerning Example 1 and showing a mask schematically.

FIGS. 1–5 show Example 1. As shown in FIG. 1, a mask 1 has a mesh member 10, mask-portions 12 having an insular shape and held onto a designated portion of the mesh member 10. The mesh member 10 includes a frame-shaped substrate 15 having setting holes 15c, and a mesh 17 spreaded on the substrate 15. In the mesh 17, wires 17x, extending in a X-direction, wires 17y, extending in a Y-direction intersect with each other, thereby forming a plurality of spaces between the wires 17x and wires 17y. A material constituting wires 17x, 17y is may be selected on request—steel family, stainless steel family, and aluminum alloy family. Width, diameter, of each of the wires 17x,17y is may be selected depending on the kind of the masks, strength for holding the mask-portions 12, a wavelength of a laser beam, or the like. As for the width of each of the wires 17x,17y, an upper limit may be 4 mm, 2 mm, 1 mm, 500 $\mu$m, or 200 $\mu$m, and a lower limit may be 10 $\mu$m, 50 $\mu$m, or 100 $\mu$m. It isn't restricted within these range.

Figure 2:
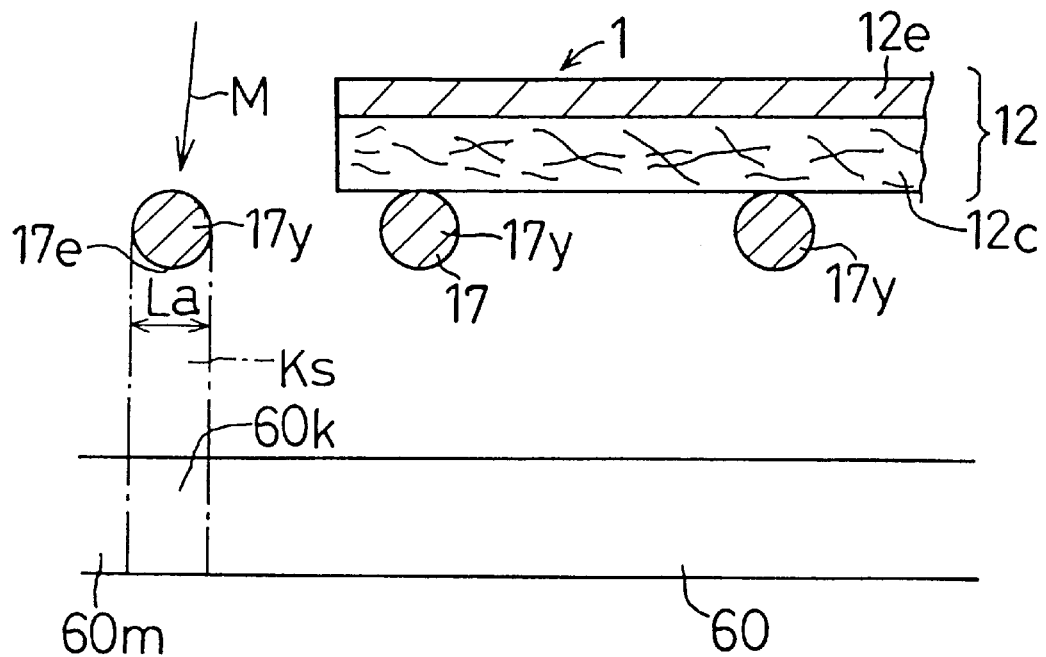
FIG. 2 is an enlarged sectioned view concerning Example 1 and showing the neighborhood of the mask schematically.

As shown in FIG. 2, the mask-portion 12 includes the bed sheet layer 12c made of paper, and an irradiation-resistant layer 12e made of metal, such as aluminum family, covering an upper surface of the bed sheet layer 12c. The bed sheet layer 12c, being made of paper, may be burned to ashes because of the laser beam. So, the bed sheet layer 12c has poor resistance to laser beams. On the other hand, the irradiation-resistant layer 12e, being made of metal such as aluminum family, greatly has a reflecting ability for reflecting laser beams. So, the irradiation-resistant layer 12e has a good durability with respect to laser beams than the bed sheet layer 12c.

The mask-portion 12 concerning Example 1 is formed by coating the irradiation-resistant layer 12e onto the upper surface of the bed sheet layer 12c by means of coating treatment for obtaining laser-resistant.

Also, the mask-portion 12 concerning Example 1 may be formed by a laminated paper, goods on the market, constituted paper coated with an aluminum layer such as a deposited aluminum film and an aluminum foil. This case can omit a coating treatment for obtaining laser-resistant, because the aluminum layer is coated beforehand.

Figure 3:
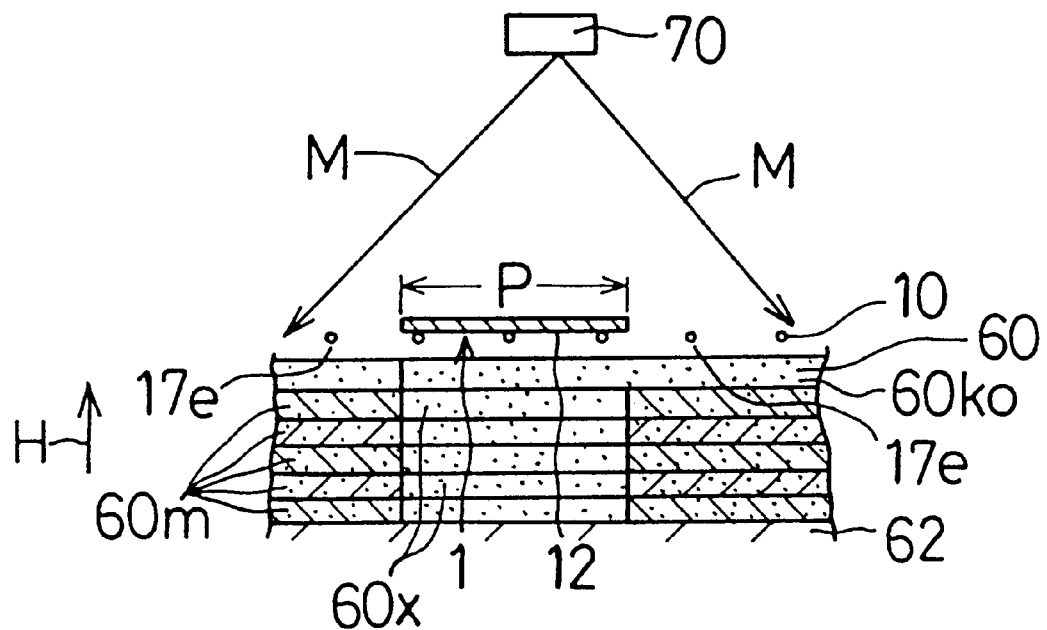
FIG. 3 is a constitutional view concerning Example 1 and schematically showing a mode in which a laser beam is emitted to a sand layer covered with the mask.

A piling process will hereinafter be explained referring to FIG. 3. FIG. 3 shows a situation in which a plurality of solid layers 60m are piled in a thickness direction. As shown in FIG. 3, resin-coated sand 60ko, working as material capable of becoming a solid layer, is thinly deposited to form a sand layer 60 on a setting surface 62. The resin-coated sand 60ko is made of sand covered with thermosetting resin such as phenol resin. As appreciated in FIG. 3, after the mask 1 is disposed over the sand layer 60, a laser head 70 located over the mask 1 emits a laser beam M, for instance a $CO_2$ laser beam, to the sand layer 60 covered with mask 1.

Example 1 allows a situation in which a thin laser beam having a small beam-diameter is continuously emitted to the sand layer 60 covered with the mask 1. Also, Example 1 allows another situation in which an enlarged laser beam laser, constituted by enlarging a thin laser beam having a small beam-diameter, is emitted to the sand layer 60 covered with the mask 1.

As for the sand layer 60, in a region irradiated with the laser beam, resin included in the resin-coated sand 60ko is heated and hardened with the laser beam M. On the other hand, in a region covered with the mask-portion 12 interrupting irradiation, namely, in a region covered by the mask-portion 12 having a length indicated P shown in FIG. 3, the resin-coated sand 60ko fundamentally isn't hardened in order to constitute a non-hardened layer 60x 1. Thus, a solid layer 60m is formed having a plane-shape corresponding to a pattern of the mask-portion 12.

The sand-discharging step and the irradiation step are alternately repeated, piling the plural solid layer 60m in the thickness direction, the direction exhibited with an arrow H, thereby forming the three-dimension laminated object. The laminated object concerning Example 1 is a casting mold.

Example 1 requires the plural masks 1 depending on the number of solid layers 60m. As understood from FIG. 2, according to the mask 1 having the mesh 17 including the wires 17x,17y, there are a fear that the width displayed by La (shown in FIG. 2) of the wires 17x,17y interrupts the laser beam M at portions Ks facing to the back surface 17e of the wires 17x,17y. If the width La is large in the wires 17x,17y, insufficiently-hardened portions 60k may occur in the solid layer 60m, as appreciated in FIG. 2. Accordingly, as appreciated in FIG. 5(A) showing a comparable example, each of the insufficiently-hardened portions 60k is disposed at the same position in a X-direction, and each of the insufficiently-hardened portions 60k is continuously overlapped in the H-direction. This overlap causes strength to deteriorate at the insufficiently-hardened portions 60k continued consecutively, and this overlaps causes the laminated object to peel from the insufficiently-hardened portions 60k.

Figure 4:
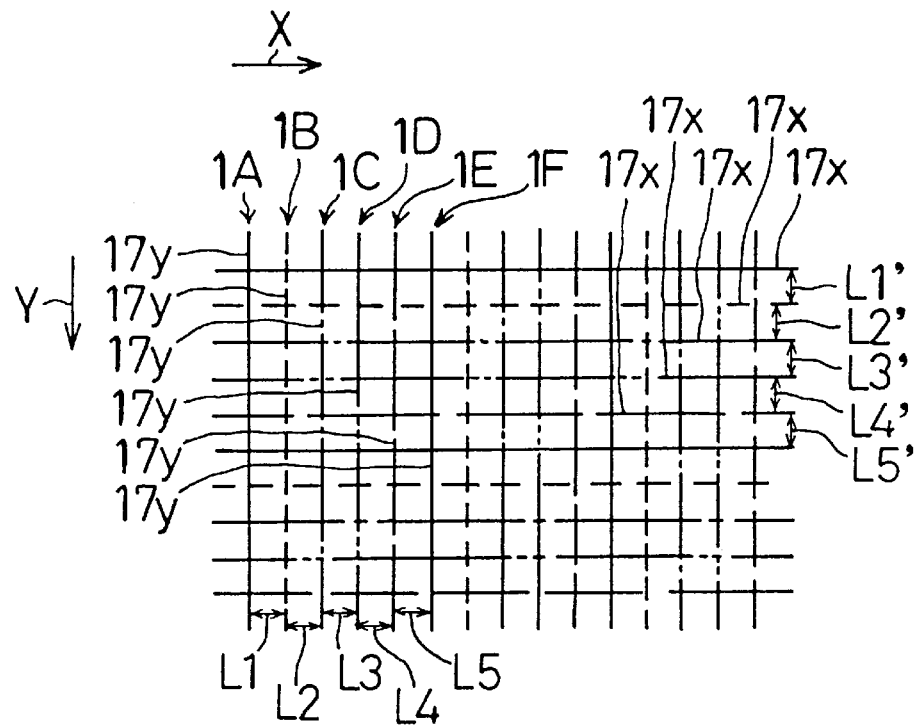
FIG. 4 is a plane view schematically showing a positional relation with respect to wires constituting masks.
Figure 5:
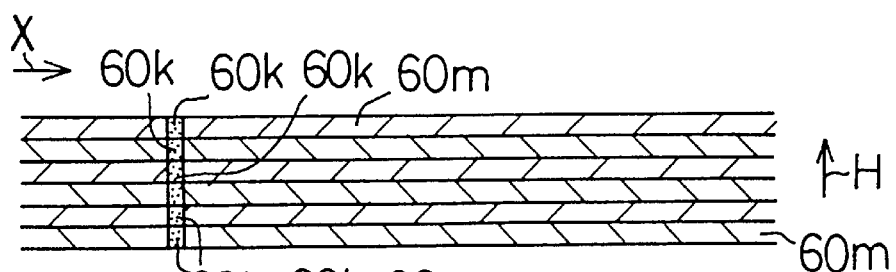
FIG. 5(A) is a sectioned view concerning a comparable example and schematically showing insufficiently-hardened portions caused by interruptions owing to wires.
FIG. 5(B) is a sectioned view showing an example of the present invention and schematically showing insufficiently-hardened portions caused by interruptions owing to wires.
Figure 5:
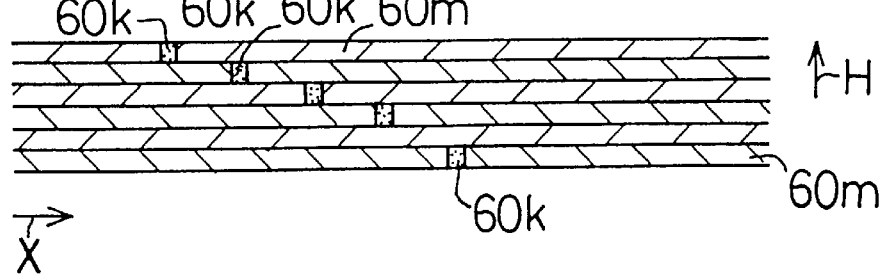

Example 1 improves peeling-resistant in the following way. The peeling-resistant will be hereinafter described considering masks 1A–1F. FIG. 4 schematically shows a basic plane situation in which the masks 1A–1F are piled. Example 1 allows use in order of the mask 1A, the mask 1B, the mask 1C, the mask 1D, the mask 1E, and the mask 1F. As appreciated in FIG. 4, wires 17y extending in the Y-direction are shifted by a distance L1 in a mask-surface direction, the X-direction, between the mask 1A to be the former and the mask 1B to be the latter. Also, wires 17y are shifted by a distance L2 in the X-direction between the mask 1B to be the former and the mask 1C to be the latter. Further, the wires 17y are shifted by a distance L3 in the X-direction between the mask 1C to be the former and the mask 1D to be the latter. The wires 17y are shifted by a distance L4 in the X-direction between the mask 1D to be the former and the mask 1E to be the latter. The wires 17y are shifted by a distance L5 in the X-direction between the mask 1E to be the former and the mask 1F to be the latter.

Similarly, the wires 17x, extending in the X-direction, constituting each of the masks 1A–1F, are shifted by a distance L1'–L5', as shown in FIG. 4.

Accordingly, even when Example 1 uses each of the masks 1A–1F in due order, Example 1 prevents each of the wires 17x constituting the masks 1A–1F from being overlapped, as much as possible, and Example 1 prevents each of the wires 17y constituting the masks 1A–1F from being overlapped as much as possible.

Therefore, as shown in FIG. 5(B), the insufficiently-hardened portions 60k, caused by the wires 17y constituting the masks 1A–1F, are shifted respectively in the mask-surface direction, the X-direction. As a result, Example 1 prevents the insufficiently-hardened portions 60k from being continuously overlapped in each of solid layers 60m, as distinct from FIG. 5(A). So, Example 1 allows the insufficiently-hardened portions 60k to be discontinuous as much as possible in the H-direction, as shown in FIG. 5(B).

Similarly, Example 1 prevents the insufficiently-hardened portions caused by overlaps of the wires 17x constituting each of the masks 1A–1F from being continuously overlapped. Thus, Example 1 is advantageous in improving peeling-resistant of the laminated object.

Embodiment Effect

According to Example 1, the bed sheet layer 12c of the mask 1 is made of paper to be burned by use of the laser beam M; nevertheless, the irradiation-resistant layer 12e coated on the bed sheet layer 12c has a laser-resistant because it has a laser-reflecting ability. Thus, Example 1 allows the mask 1 made of paper to have a laser-interrupting ability.

Also, since Example 1 has the bed sheet layer 12c made of paper, Example 1 exhibits a good cutting ability in that a designated pattern is cut by use of the laser beam in the bed sheet layer 12c, as compared with the conventional mask made by cutting a thickened metal plate by use of laser beam. So, Example 1 is advantageous in shortening time for producing a mask, in reducing a mask cost, and decreasing mask-weight.

Figure 17:
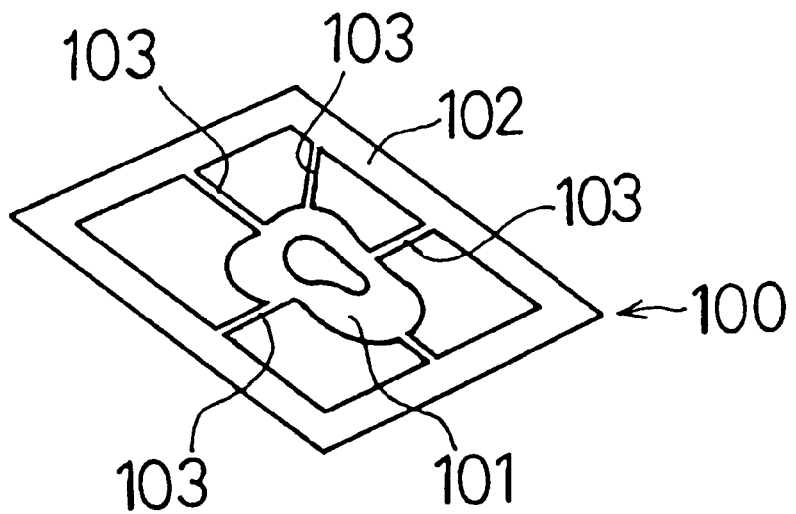
FIG. 17 is a perspective view concerning a conventional mask.

According to Example 1, the wires 17x,17y constituting the mesh 17 have a function for holding the insular-shaped mask-portions 12. So, Example 1 is capable of omitting the supporting arms 103 for holding the insular-shaped mask-portion 101 as distinct from FIG. 17, thereby abolishing a complicated computer program for cutting the plural supporting arms 103 by use of laser beam.

Since the wires 17x,17y of the mesh 17 have a small width, Example 1 improves in spreading the laser beam at the back surface 17e of the wires 17x,17y, as compared with the conventional supporting arms 103 having a wide width.

Further, as mentioned above, since wires 17x,17y are shifted in the mask-surface direction in forming the solid layers 60m, Example 1 improves peeling-resistant in the laminated object.

EXAMPLE 2

FIGS. 6(A)–6(D) show Example 2. Example 2 is the same as Example 1 in constitution, exhibiting the same numerals with respect to portions having the same function as Example 1. Example 2 substantially displays the same advantages as Example 1.

Figure 6:
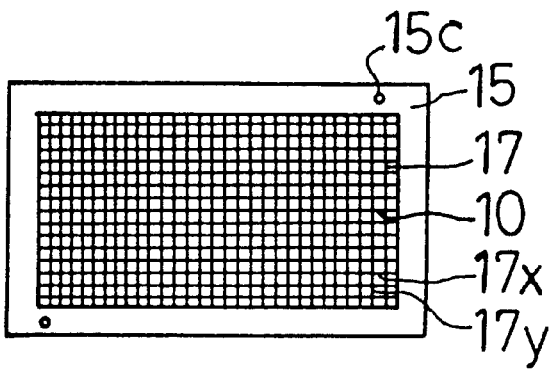
FIGS. 6 (A)–(D) are plane views concerning Example 2 and schematically showing a mask-producing method.
Figure 6:
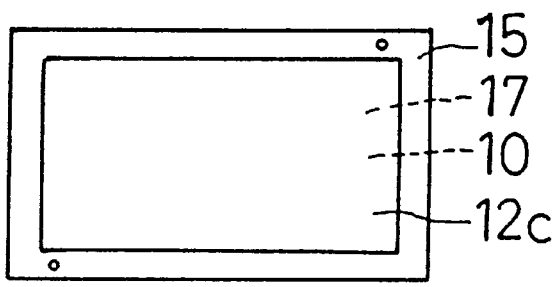
Figure 6:
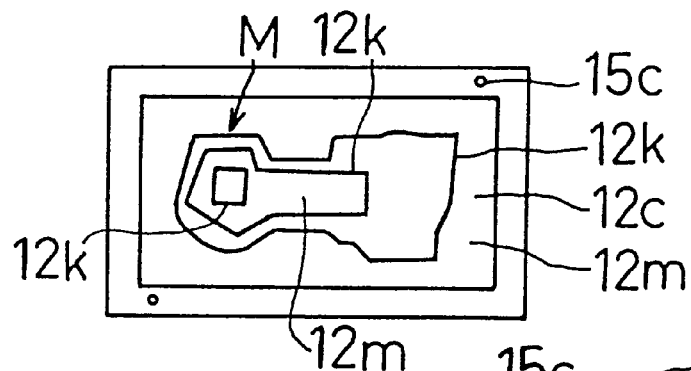
Figure 6:
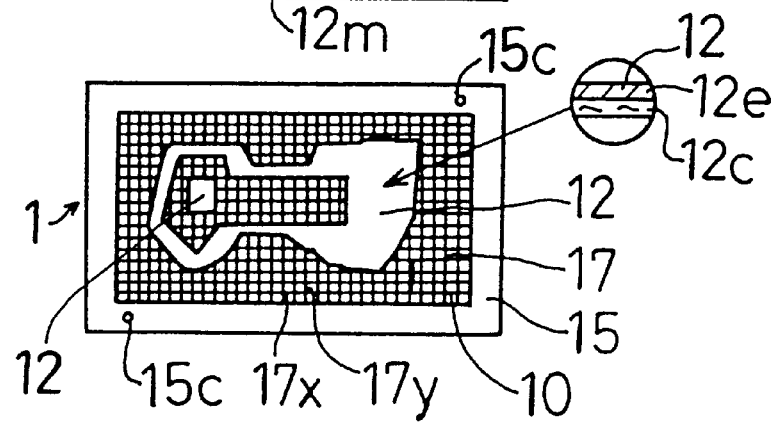

As shown in FIG. 6(A), for producing a mask 1, Example 2 uses a mesh member 10 made by holding a mesh 17 onto a substrate 15 having a frame-shape. As shown in FIG. 6(B), a bed sheet layer 12c made of paper adheres with a binder onto mesh-portions constituted by wires 17x,17y of the mesh 17. Thereafter, the laser beam M is emitted to the bed sheet layer 12c to make cutting tracks 12k as shown in FIG. 6(C), thereby cutting a designated pattern from the bed sheet layer 12c so as to remove unnecessary portions 12m.

Thereafter, an upper surface of the bed sheet layer 12c is treated with a coating treatment to generate laser-resistant; so, the upper surface of the bed sheet layer 12 is covered with the irradiation-resistant layer 12e so as to make mask-portions 12 having a laser-reflecting ability.

The treatment to generate the irradiation-resistant layer 12e is carried out by coating a liquid dispersing metal powder such as aluminum, by use of a spray or a brush. A thickness of the laser-resistant coat is preferably thick so as to suppress the laser beam from penetrating the bed sheet layer 12c. The irradiation-resistant layer 12e may reinforce the bed sheet layer 12c made of the paper to strengthen the mask-portions 12.

EXAMPLE 3

FIGS. 7(A)–7(D) show Example 3. Example 3 is the same as Example 2 in constitution, exhibiting the same numerals with respect to portions having the same function as Example 2. Example 3 displays the same advantages as Example 2.

Example 3 uses a sheet material 80. The sheet material 80 have a bed sheet layer 12c made of paper, and an irradiation-resistant layer 12e made of aluminum and coated thereon so as to exhibit a laser-reflecting ability. The sheet material 80 is set on a XY-plotter (not shown), so that cutting tracks 80k are generated by use of a cutter provided with the XY-plotter. An unnecessary portions 80m are removed to form mask-portions 12. So, the mask-portions 12 are constituted by the bed sheet layer 12c made of the paper and by the irradiation-resistant layer 12e exhibiting a laser-reflecting ability.

Figure 7:
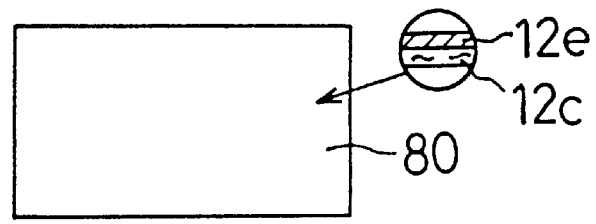
FIGS. 7(A)–(D) are plane views concerning Example 3 and schematically showing a mask-producing method.
Figure 7:
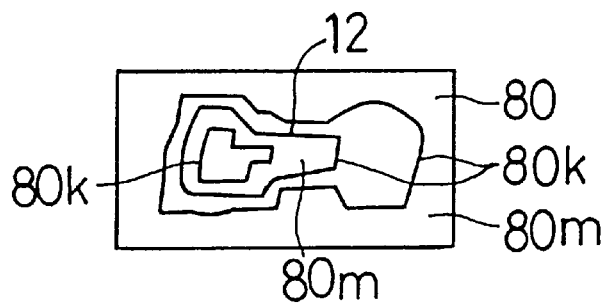
Figure 7:
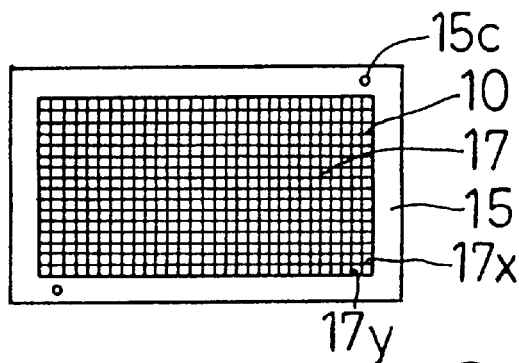
Figure 7:
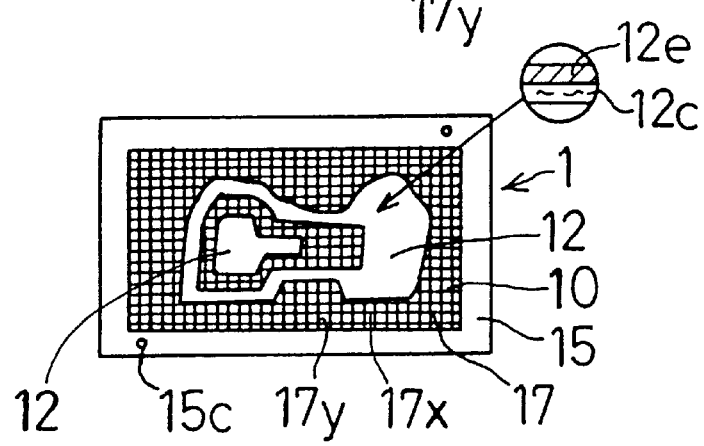
Figure 8:
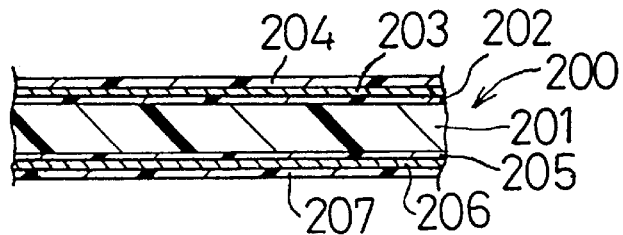
FIG. 8 is a sectioned view concerning Example 4 and schematically showing a sheet material having a deposited aluminum film.

As shown in FIG. 7(D), Example 3 uses a mesh member 10 made by holding a mesh 17 onto a frame-shaped substrate 15. The mask-portions 12 adheres with binder onto mesh-portions constituted by wires 17x,17y of the mesh 17, thereby forming the mask 1.

Example 3 uses a mode in which the mask-portions 12 adheres onto the mesh member 10 after the mask-portions 12 are made by cutting the sheet material 80. So, Example 3 is advantageous in using a mechanical cutter for obtaining the mask-portions 12.

EXAMPLE 4

FIGS. 8–13 show Example 4 which uses a sheet material 200. The sheet material 200 includes: a base film 201 working as a bed sheet layer; a binder layer 202 coated on the front surface of the base film 201; an aluminum vapour deposited film 203 coated on the front surface of the binder layer 202; a protecting layer 204 coated on the aluminum vapour deposited film 203 to dispose at the frontside thereof; a binder layer 205 coated on the back surface of the base film 201; an aluminum vapour deposited film 206 coated on the back surface of the binder layer 205; and a protecting layer 207 coated on the aluminum vapour deposited film 206 to dispose at the backside thereof The base film 201 is 0.2–0.3 mm in thickness, and it is made from polyethylene terephthalate (PET) in view of ensuring size-stability and heat-resistant. Each of the aluminum vapour deposited films 203,206 has a film-body and an aluminum-deposited layer having an average thickness of 500–800 Å. The protecting layers 204,207, being made basically from an acrylic resin having a thickness of 0.5 $\mu$m, exhibit a function for protecting the aluminum vapour deposited films 203,206, and they exhibit a function for a laser beam to penetrate therethrough.

Figure 9:
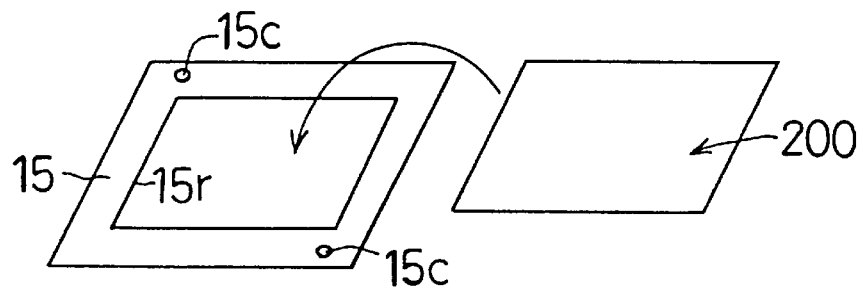
FIG. 9 is a perspective view concerning Example 4 and schematically showing a situation in which a sheet material isn't set onto a substrate.
Figure 10:
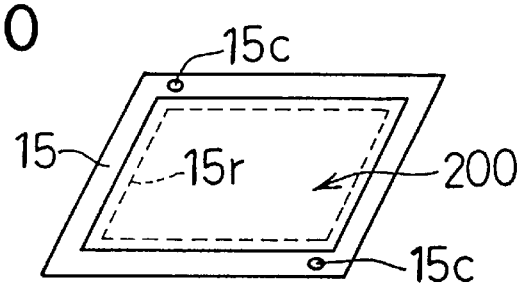
FIG. 10 is a perspective view concerning Example 4 and schematically showing a situation in which the sheet material is set onto the substrate.
Figure 11:
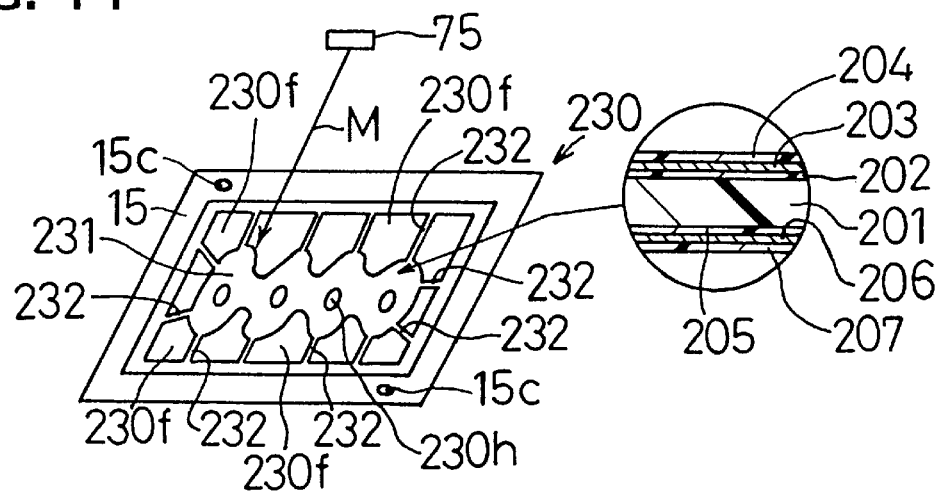
FIG. 11 is a perspective view concerning Example 4 and schematically showing a situation in which a mask-portion is cut by use of a laser beam.

As shown in FIGS. 9,10, the sheet material 200 adheres onto a frame-shaped substrate 15 so as to cover an opening 15r thereof. Thereafter, as shown in FIG. 11, the laser beam M emitted from a laser head 75 cuts the sheet material 200 to carry out a cutting treatment, thereby making a mask 230 having a constitution in which a plurality of supporting portions 232, having an arm-shape, hold the insular mask-portion 231. Numerals of 230f, 230h exhibit openings formed in the mask 230.

An inner constitution of the mask-portion 231 is the same as that of the above-mentioned sheet material 200. So, as shown in FIG. 11, the mask-portion 231 includes: a base film 201 working as a bed sheet layer; binder layers 202,205 coated on the front surface and the back surface of the base film 201; aluminum vapour deposited films 203,206 coated on the binder layers 202,205; protecting layers 204,207 coated on the aluminum vapour deposited films 203,206. Namely, the aluminum vapour deposited films 203 is coated at the front surface of the mask-potion 231: the aluminum vapour deposited films 206 is coated at the back surface of the mask-potion 231.

Figure 12:
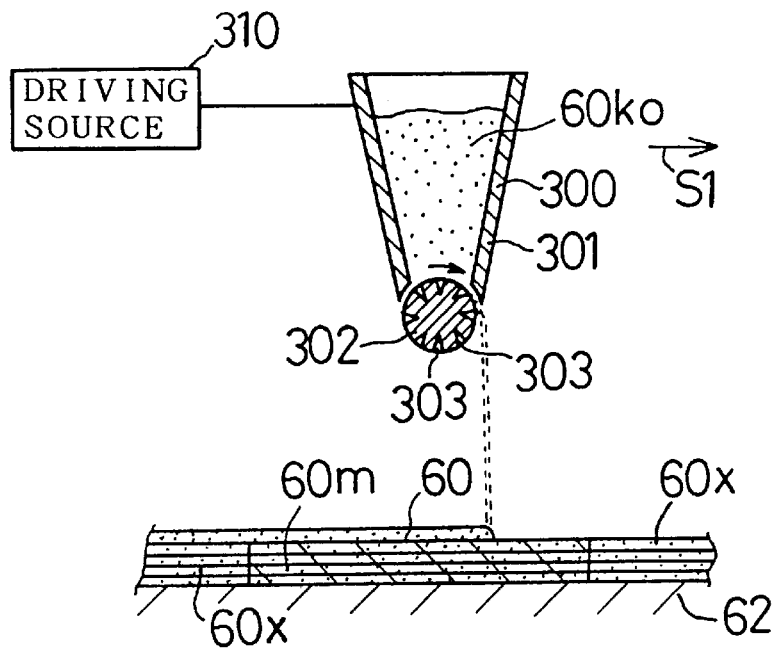
FIG. 12 is a sectioned view concerning Example 4 and schematically showing a sand-discharging step in which a sand layer is constituted by discharging resin-coated sand.

Example 4 carries out a sand-discharging step, as shown in FIG. 12. A sand-discharging apparatus 300 includes a container 301 for storing resin-coated sand 60ko, a rotatable cutting roller 302 at the bottom of the container 301. The cutting roller 302 has a plurality of grooves 303 disposed in a circumferential direction thereof. While rotating the cutting roller 302, the container 301 is moved in a direction S1 by a driving source 310 to discharge the resin-coated sand 60ko outwardly so as to form a sand layer 60.

Figure 13:
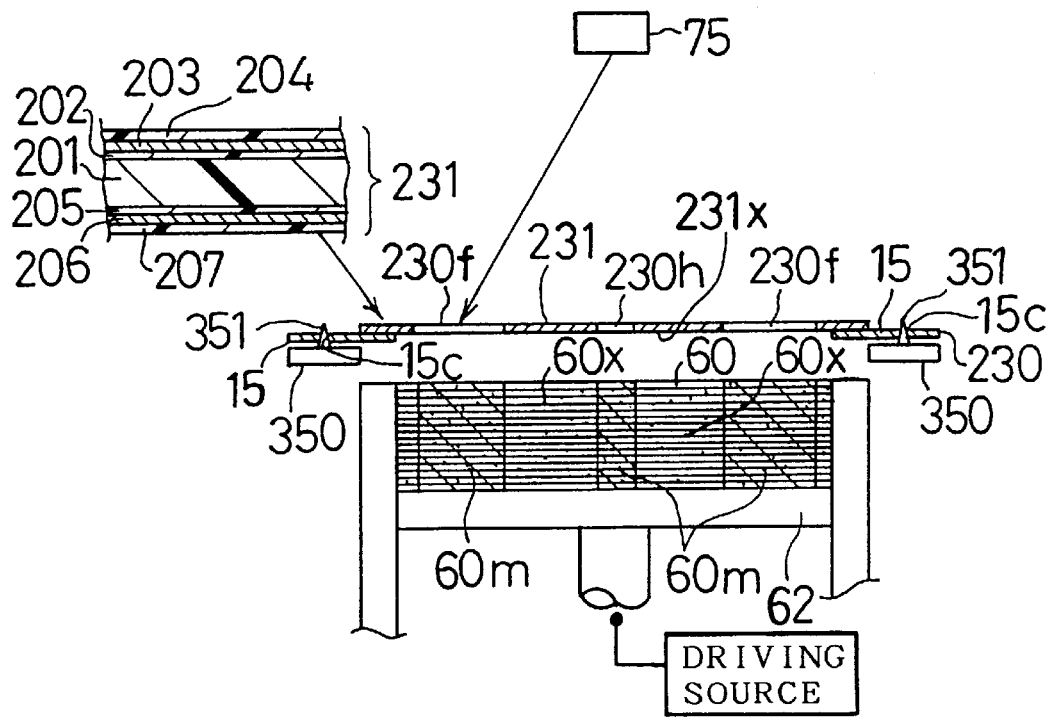
FIG. 13 is a sectioned view concerning Example 4 and schematically showing an irradiation step in which the sand layer is irradiated with a laser beam to form a solid layer.

Afterthat, Example 4 carries out an irradiation step shown in FIG. 13. Namely, Example 4 sets the mask 230 by inserting holes 15c of the substrate 15 of the mask 230 into pins 351 of the maskholder 350. So, Example 4 disposes the mask 230 over the sand layer 60 so as to cover the sand layer 60 with the mask 230. Next, the laser head 75 emits the laser beam ($CO_2$ laser).

In the sand layer 60, a region irradiated with the laser beam, penetrating through the openings 230f,230h, is hardened to form a solid layer 60m. In the sand layer 60, a region covered with the mask-portion 231 to interrupt irradiation isn't hardened.

In Example 4, the aluminum vapour deposited films 203 is coated on the front surface of the mask-potion 231: the aluminum vapour deposited films 206 is coated on the back surface of the mask-potion 231.

When the laser beam penetrates through the openings 230f,230h of the mask 230 in FIG. 13, the laser beam sometimes reflects at the sand layer 60 in such a manner that the laser beam reaches the back surface 231x of the mask-potion 231. In this situation, Example 24 allows the laser beam to reflect at the aluminum vapour deposited films 206 disposed at the back surface 231x of the mask-potion 231. Thus, it is suppressed that the back surface 231x of the mask-portion 231 is irradiated with laser beams. So, Example 4 is advantageous in preventing temperature from increasing in the mask-portion 231, thereby suppressing a heat-deformation to ensure shape-accuracy of the mask-portion 231, further thereby suppressing heat-deterioration of the mask-portion 231 to improve durability thereof.

The above-mentioned sand-discharging step and irradiation step are alternately repeated to produce a laminated object.

In Example 4, the laser beam for cutting the mask had an output of 25 W and a spot diameter of 0.2 mm, and the laser beam for the irradiation step had an output of 1000 W and a spot diameter of 30 mm.

The laser beam for the irradiation step and the laser beam for cutting the mask are a $CO_2$ laser beam. In this case, when Q1 exhibits energy density in cutting the mask, Q2 exhibits energy density for the irradiation step, Example 3 induces a relation of Q1>Q2, because of a relation of $(25/0.2^2)$>$(1000/30^2)$, namely, a relation of 625>1.1. The laser beam for cutting the mask—energy density is large—is capable of cutting the aluminum vapour deposited films 203,206 of the mask-portions 231. On the contrary, the laser beam for the irradiation step—energy density is small—isn't capable of cutting the aluminum vapour deposited films 203,206 of the mask-portions 231.

Example 4 employs one mode in which both the irradiation step and the cutting the mask require a $CO_2$ laser beam. In place of this mode, Example 4 may employ another mode in which the cutting the mask requires a YAG laser beam having an advantage to cut aluminum easily, and the irradiation step requires a $CO_2$ laser beam having an advantage to easily be absorbed into resin of the resin-coated sand.

In accordance with tests carried out by the present inventors, the YAG laser beam was disadvantageous in equipment costs; nevertheless it was advantageous in cutting aluminum. The $CO_2$ laser beam was advantageous in equipment costs and in being absorbing into resin-coated sand as compared with the YAG laser beam.

Even when the aluminum vapour deposited films 203,206 are thick, the YAG laser beam, having an aluminum-cutting ability, cuts the aluminum vapour deposited films 203,206 easily. Using the YAG laser beam allows an aluminum foil to be used in place of the aluminum vapour deposited films 203,206.

Figure 14:
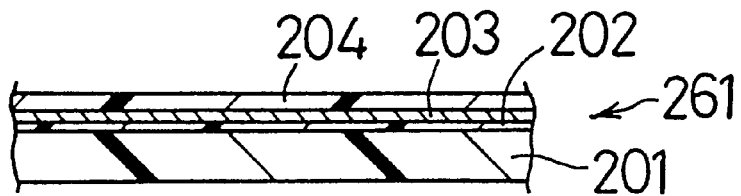
FIG. 14 is a sectioned view concerning Example 5 and schematically showing a mask-portion having a deposited aluminum film.

The present invention may use a mask-portion 261 having a sectioned constitution concerning Example 5 shown in FIG. 14. The mask-portion 261 concerning FIG. 14 includes: a base film 201; a binder layer 202 coated on front surface of the base film 201; an aluminum vapour deposited films 203 coated on the binder layer 202; a protecting layer 204 coated on the aluminum vapour deposited films 203 to dispose at the frontside thereof.

The present inventors investigated existence of an aluminum vapour deposited film. In this investigation, the present inventors used three mask-portions as specimens: the first mask-potion in which aluminum vapour deposited films was coated on both the front surface and the back surface thereof; the second mask-portion in which an aluminum vapour deposited film was coated only on the front surface thereof; and the third mask-portion being free of an aluminum vapour deposited film.

Figure 15:
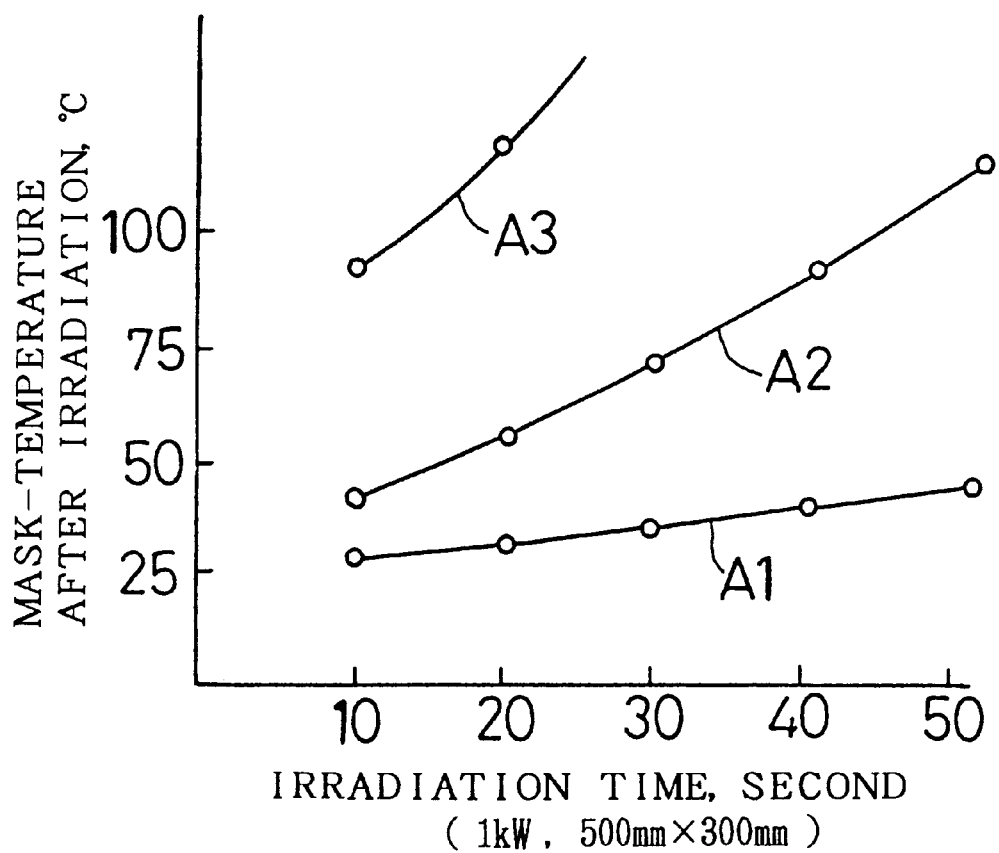
FIG. 15 is a graph concerning results in investigation.

FIG. 15 shows the results. In FIG. 15, a horizontal axis exhibits irradiation time with respect to an area having 500 mm×300 mm, and a vertical axis exhibits mask-temperature after irradiation. In FIG. 15, a characteristic line A1 exhibits results about the first mask-portion in which the aluminum vapour deposited films was coated on both the front surface and the back surface thereof. A characteristic line A2 exhibits results about the second mask-portion in which the aluminum vapour deposited films was coated only on the front surface thereof. A characteristic line A3 exhibits results about the third mask-portion being free of the aluminum vapour deposited film.

As understood from the characteristic line A3, the third mask-portion, being free of the aluminum vapour deposited film, displayed high temperature in a short time, thereby sometimes inducing heat-deformation or burning of the base film constituting the mask-potions, further thereby being unsuitable as a mask. As understood from the characteristic line A1, in the first mask-portion in which the aluminum vapour deposited films was coated on both the front surface and the back surface thereof, mask-temperature was suppressed even when irradiation time is long. The reason may be that the aluminum vapour deposited films is good in reflecting the laser beam and in transmitting heat.

As understood from the characteristic line A2, in the second mask-portion in which the aluminum vapour deposited films was coated only the front surface thereof, mask-temperature was increased than that of the characteristic line A1; nevertheless, mask-temperature was relatively suppressed. So, the second mask-portion is usable provided that irradiation time is short.

Also, in place of the aluminum vapour deposited film, the present inventors investigated in the cutting of an aluminum foil coated on the base film, on the same conditions. In this investigation, the cutting of the mask wasn't easy because of the aluminum foil. Excessive increase in the laser output power, 1000 W ($CO_2$ laser beam, spot diameter: 0.2 mm), can cut the mask having the aluminum foil.

EXAMPLE 6

Figure 16:
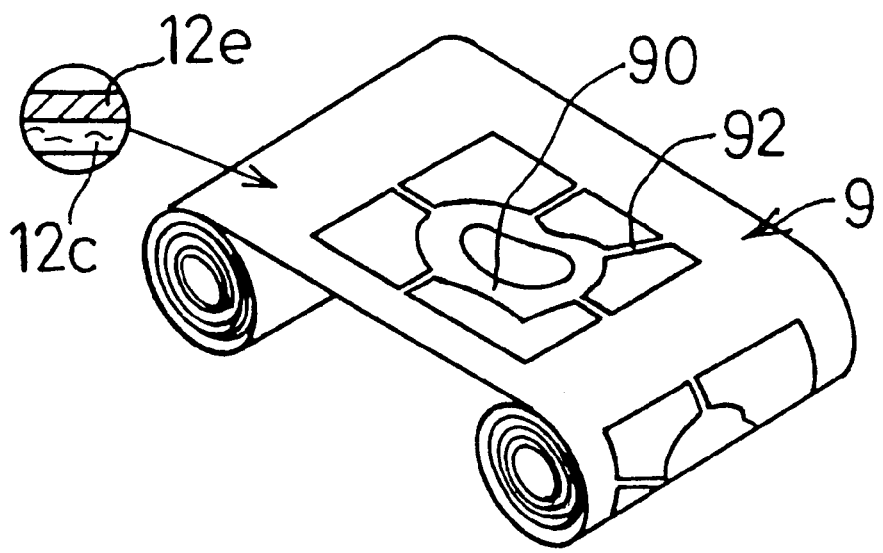
FIG. 16 is a perspective view concerning Example 6 and showing a mask.

FIG. 16 shows Example 6. A mask 9 has a rolled-shape in which a plurality of patterns are disposed in series in a rolling direction thereof. The mask 9 comprises a bed sheet layer 12c made of paper or resin, and an irradiation-resistant layer 12e coated on the bed sheet layer 12c made of aluminum and having a laser-reflecting ability. The mask 9 has insular mask-portions 90 and a plurality of supporting arms for holding mask-portions 90. In Example 6, the plural patterns are disposed in series in the rolling direction thereof; so, the mask 9 is advantageous in small-size.

Other Examples

Example 1 uses the mesh 17 in which the wires 17x extending in the X-direction and wires 17y extending in the Y-direction intersects with each other. In place of the mesh 17, another example allows another mesh in which main portions thereof are basically made of wires 17x extending in the X-direction. Also, still another example allows a mesh in which main portions thereof are basically made of wires 17y extending in the Y-direction. Further another example allows a mesh made of wires inclining with respect to the wires extending in the X-direction and the wires extending in the Y-direction.

The aforementioned Examples 1–6 use the laser beam as energy for hardening the resin-coated sand. In place of the laser beam, another example may use a mask for interrupting a far infrared ray working as energy to harden the resin-coated sand.

Also, further another example may use a mask for interrupting an ultraviolet ray working as energy to harden the ultraviolet-hardened resin.

The present invention isn't restricted within the above-mentioned examples, allowing modified versions within the split or scope of the present invention including the appended claims.

What is claimed is:

1. A mask for use in a piling process for producing a three-dimensional laminated object by piling a plurality of solid layers each formed by receiving energy emitted from an emitting source, said mask comprising:
   (a) a mask portion having
      (i) a bed sheet layer having a designated pattern shape and having an irradiation side; and
      (ii) an irradiation-resistant layer for interrupting said emitted energy and being coated on said irradiation side of said bed sheet layer and having a greater durability with respect to said emitted energy than that of said bed sheet layer; and
   (b) a support for holding said mask portion, said support having one or more openings which allow emitted energy to pass through said one or more openings.

2. The mask according to claim 1, wherein said emitted energy is a laser beam.

3. The mask according to claim 1, wherein a basic ingredient of said bed sheet layer is organic material.

4. The mask according to claim 3, wherein said organic material is at least one of a paper and a resin.

5. The mask according to claim 4, wherein said paper is at least one selected from the group consisting of machine-made paper, Japanese paper, and synthesized paper.

6. The mask according to claim 4, wherein said resin is at least one selected from the group consisting of polyethylene terephthalate (PET), polymethyl methacrylate (PMMA), polyimide (PI), polyethylene (PE), polypropylene (PP), polystyrene (PS), and polyvinyl chloride (PVC).

7. The mask according to claim 1, wherein said bed sheet has a thickness in the range from 0.05 mm to 5 mm.

8. The mask according to claim 1, wherein another irradiation-resistant layer is coated on a side of said bed sheet opposite said irradiation side of said bed sheet layer so to as to face said solid layers when the mask is used.

9. The mask according to claim 1, wherein a basic ingredient of said irradiation-resistant layer is metal.

10. The mask according to claim 1, wherein said irradiation-resistant layer is constituted by a deposited coat.

11. The mask according to claim 10, wherein a basic ingredient of said deposited coat is at least one substance selected from the group consisting of aluminum, zinc, tin, molybdenum, and nickel-chromium.

12. The mask according to claim 10, wherein said deposited coat is made of a material deposited on said bed sheet layer.

13. The mask according to claim 10, wherein said deposited coat has a thickness in the range of from 50 Å to 2 μm.

14. The mask according to claim 10, wherein said deposited coat has an average thickness in the range from 500 Å to 800 Å (in average thickness).

15. The mask according to claim 10, wherein said deposited coat is covered with a protecting coat for improving wear-resistant.

16. The mask according to claim 1, wherein said irradiation-resistant layer is made of a dispersed material which has been deposited on said bed sheet layer.

17. The mask according to claim 1, wherein said irradiation-resistant layer is formed of at least one of a metal film or a metal foil adhered on said bed sheet layer.

18. The mask according to claim 1, wherein said support is a mesh member, and said bed sheet layer is supported on said mesh member when the mask is used.

19. The mask according to claim 18, wherein said mesh member includes wires having a width in the range from 10 μm to 2 mm.

20. The mask according to claim 18, wherein said mesh member has wires made of metal.

21. The mask according to claim 1, wherein said bed sheet layer has a rolled-shape in which a plurality of patterns are arranged side by side in a rolling direction.

22. A method for employing masks in a process for producing a three-dimensional laminated object by piling a plurality of solid layers each formed by depositing a layer of a material capable of becoming a solid layer when irradiated with energy emitted from an emitting source and irradiating a portion of said layer of material with the emitted energy, the method comprising the steps of:

using in succession at least a first mask and a second mask, and each of said masks having a mesh member formed of a plurality of wires for supporting a mask portion;

irradiating a first layer of said deposited material with said emitted energy while using said first mask, the wires of the mesh member having a first wire-position;

irradiating a second layer of said deposited material while using said second mask, the wires of said second mask having a second wire-position shifted from that of wires in the first wire position in a direction along the mask surface by a distance which suppresses overlap of wires in said first wire-position when said second layer is irradiated.

23. The method according to claim 22, wherein each of said wires has a width in the range from 10 μm to 4 mm.

24. The mask according to claim 1, further including a substrate having a frame-shape forming an opening in the substrate, wherein said support is made of a mesh member held on said substrate and covering said opening, and said mask portion is supported on said mesh member.

25. The mask according to claim 1, further including a substrate having a frame-shape forming an opening in the substrate, and said support is bridged across said opening in said substrate between said substrate and said mask portion.

26. The mask according to claim 18, wherein said mesh member is formed of a plurality of first wires extending in a first direction and a plurality of second wires extending in a second direction.

* * * * *